United States Patent
Akagawa

(10) Patent No.: US 6,759,268 B2
(45) Date of Patent: Jul. 6, 2004

(54) SEMICONDUCTOR DEVICE AND MANUFACTURING METHOD THEREFOR

(75) Inventor: Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/158,155

(22) Filed: May 31, 2002

(65) Prior Publication Data

US 2002/0146859 A1 Oct. 10, 2002

Related U.S. Application Data

(62) Division of application No. 09/754,323, filed on Jan. 5, 2001.

(30) Foreign Application Priority Data

Jan. 13, 2000 (JP) .......................................... 2000-4296

(51) Int. Cl.[7] .......................... H01L 21/44; H01L 21/48; H01L 21/50
(52) U.S. Cl. ....................... 438/106; 438/107; 438/108; 438/109; 438/112; 438/614; 438/615; 438/622
(58) Field of Search ................................ 438/106, 107, 438/108, 109, 112, 614, 615, 622, 624, 612; 257/686, 698, 723

(56) References Cited

U.S. PATENT DOCUMENTS 5,353,498 A    10/1994  Fillion et al.
6,235,554 B1 *  5/2001  Akram et al. ................ 438/109
6,300,244 B1 * 10/2001  Itabashi et al. ............. 438/678
6,362,529 B1 *  3/2002  Sumikawa et al. .......... 257/777
6,608,371 B2 *  8/2003  Kurashima et al. ......... 257/686
2002/0004288 A1 *  1/2002  Nishiyama .................. 438/464

FOREIGN PATENT DOCUMENTS

JP              04302446     * 10/1992      ........... H01L/21/60

* cited by examiner

Primary Examiner—W. David Coleman
Assistant Examiner—Khiem Nguyen
(74) Attorney, Agent, or Firm—Staas & Halsey LLP

(57) ABSTRACT

An object of the present invention is to make it possible to effect a reliable and compact configuration for a semiconductor device when mounting a plurality of semiconductor elements in a single package, and achieve higher integration and higher functionality more effectively. In a multi-layer wiring board 20 in which wiring patterns (conductor layers) 22, 24, and 26, and insulating layers 23, 25, and 27, are formed alternately in multiple layers on a base substrate, and electrically connections are made between the wiring patterns through via holes VH1 and VH2, semiconductor elements 30 are imbedded and mounted inside the insulating layers 23, 25, and 27, and the semiconductor elements 30 are deployed so that they are electrically connected to wiring patterns that are covered by the insulating layers, and so that they are stacked up in a direction perpendicular to the planar dimension of the multi-layer wiring board 20.

18 Claims, 6 Drawing Sheets

SEMICONDUCTOR DEVICE AND MANUFACTURING METHOD THEREFOR

This application is a division of application number 09/754,323, filed Jan. 5, 2001, now pending.

BACKGROUND OF THE INVENTION

1. Field of the Invention

This invention relates to a semiconductor device and manufacturing method therefor, and particularly to technology useful for effectively realizing higher integration and higher functionality in a semiconductor device wherein a plurality of semiconductor elements (chips) is mounted in a single package.

2. Description of the Related Art

In FIG. 1 are diagrammed examples of semiconductor devices of the type described above.

In the examples diagrammed, semiconductor devices are represented wherein a plurality of semiconductor chips is mounted on one substrate. In the example in FIG. 1A, semiconductor chips 2 are mounted on both surfaces of a substrate 1; in the example in FIG. 1B, semiconductor chips 2 and 2a are mounted in a stacked configuration on one surface of the substrate 1; in the example in FIG. 1C, a plurality of semiconductor chips 2 is mounted in a plane on the substrate 1; and in the example in FIG. 1D, one semiconductor chip 2 is mounted on one surface of the substrate 1, while a plurality of semiconductor chips 2 is mounted on the other surface thereof. These examples are respectively diagrammed schematically.

On the surface of the substrate 1, wiring patterns are formed as appropriate. To the wiring patterns, the electrode terminals (not shown) of the semiconductor chips 2 and 2a are electrically connected by wire bonding. The electrical connections between the semiconductor chips and the wiring patterns are not limited to wire bonding connection, and flip chip connections or TAB connections or the like can also be used.

In a conventional semiconductor device as described above, the semiconductor chips 2 and 2a are mounted in a mounting surface of the substrate 1, wherefore, due to the fact that the substrate 1 is made in regular sizes, the number of semiconductor chips that can be mounted is limited, which is a disadvantage.

When the semiconductor chips 2 and 2a are mounted in a stack, as diagrammed in FIG. 1B, the upper chip 2 must be made smaller than the lower chip 2a by an amount necessary for the area which is required to make the wire bonding connections. For that reason, the mounting area for the upper chip 2 becomes smaller, and there is inherently a limit to the number of chips that can be stacked.

In this case, when flip chip connections are used, there is no need to provide a region for bonding as described above, wherefore it is possible to increase the number of mounted chip as compared to the case of wire bonding connection. However, other difficulties arise instead.

With flip chip mounting, in general, solder bumps or other metal bumps (electrode terminals) are formed on the electrode pads of the semiconductor chips, and connections are effected by thermally pressing these bumps down on corresponding electrode pads on a mounting substrate such as a printed circuit board. When this method is applied to a stacked chip configuration as diagrammed in FIG. 1B, the upper chip 2 will be flip-chip connected to the lower chip 2a. In this case, it is necessary to form the electrode pads on the upper surface of the lower chip 2a so as to correspond with the positions of the bumps that are the electrode terminals of the upper chip 2. Also, when stacking the chips, alignment must be effected between the bumps on the upper chip and the electrode pads on the lower chip, making the overall process complex, which is a disadvantage.

When mounting a plurality of semiconductor chips in a single package in this manner, with a method as diagrammed in FIG. 1 in which the semiconductor chips 2 and 2a are simply mounted on the mounting surface or surfaces of the substrate 1, the number of semiconductor chips that are mounted is limited, and it is not always possible to realize adequately high integration and functionality.

That being so, in terms of a method for effecting higher integration and higher functionality, semiconductor device configurations have been devised in which the substrate is made in multiple layers, and semiconductor elements are provided inside the substrate. If use is made of a multi-layer substrate structure wherein a plurality of wiring layers is provided, for example, it is possible to electrically interconnect the semiconductor chips and deploy them three-dimensionally inside the substrate. It is not necessarily easy, however, to imbed the semiconductor chips inside the substrate and form the wiring layers in multiple layers. When the recent demands for making packages smaller and lighter in weight are taken into consideration, furthermore, there are problems which must be faced, such as the necessity of forming the semiconductor devices compactly with the overall thickness thereof made thinner.

SUMMARY OF THE INVENTION

An object of the present invention, which was devised in view of such problems in the prior art, is to provide a semiconductor device, and manufacturing method therefor, with which it is possible, when mounting a plurality of semiconductor elements (chips) in a single package, to make the configuration reliable and compact, and wherewith higher integration and higher functionality can be realized more effectively.

In order to resolve the problems with the prior art stated in the foregoing, in the present invention, effective use is made of the build-up method and other multi-layer wiring technologies in which advances have been made in recent years, in terms of effecting practicality, in the field of semiconductor packaging.

A multi-layer wiring board for which the build-up method is used, for example, is generally built up by sequentially repeating a process for forming an insulating layer, a process for forming a via hole in the insulating layer, and a process for forming a conductor layer (wiring pattern) that includes the interior of the via hole. If a multi-layer wiring board obtained by such a build-up method is used, it is possible to imbed and mount semiconductor elements (chips) exhibiting enhanced integration levels, etc., in the built-up layers, and to provide electrical connection therebetween.

Accordingly, based on one aspect of the present invention, a semiconductor device is provided that comprises: a multi-layer wiring board in which conductor layers having wiring patterns formed thereon are formed in multiple layers with an insulating layer interposed therebetween and the wiring patterns are mutually electrically connected through via holes that pass through the insulating layers; and semiconductor elements that are mounted and imbedded inside each of the insulating layers of that multi-layer wiring board; wherein the semiconductor elements are electrically connected to the wiring patterns that are covered by those insulating layers, and are stacked up in a direction perpendicular to plane of the surface of the multi-layer wiring board.

More specifically, the present invention is as follows.

1. A semiconductor device comprising:
   a base substrate on one surface of which wiring patterns are formed;
   a plurality of insulating layers located on and above the surface thereof;
   conductor layers having wiring patterns formed therein and located on the insulating layers; and
   semiconductor elements imbedded and mounted inside the insulating layers; wherein:
      the wiring patterns are mutually electrically connected, passing through the insulating layers; and
      the semiconductor elements are electrically connected to the wiring patterns.

2. The semiconductor device described in 1 above, wherein one or more semiconductor elements are imbedded and mounted inside each of the plurality of insulating layers.

3. The semiconductor device described in 1 above, wherein two or more semiconductor elements are imbedded and mounted inside each of the plurality of insulating layers.

4. The semiconductor device described in 1 above, wherein the thickness of the semiconductor elements is 50 µm or less.

5. The semiconductor device described in 1 above, wherein the semiconductor elements and wiring patterns corresponding thereto are electrically connected by flip chip mounting.

6. The semiconductor device described in 1 above, wherein the semiconductor elements and wiring patterns corresponding thereto are electrically connected via an anisotropically conductive film.

7. A semiconductor device manufacturing method comprising:
   a first step for forming a wiring pattern on one surface of an insulative base substrate;
   a second step for mounting a prescribed number of semiconductor elements on the wiring patterns;
   a third step for forming an insulating layer on the base substrate and the wiring patterns so as to cover the semiconductor elements;
   a fourth step for forming via holes in the insulating layer so as to reach to the wiring pattern on the base substrate;
   a fifth step for forming a conductor layer having a wiring pattern, on the insulating layer, inclusive of the inner walls of the via holes;
   a sixth step for repeating steps similar to the second to fifth steps until the requisite number of wiring pattern layers is formed, and finally forming an insulating layer at the uppermost layer; and
   a seventh step for forming, on the other surface of the base substrate, external connection terminals which are electrically connected with the wiring patterns on the base substrate through the base substrate.

8. The semiconductor device manufacturing method described in 7 above, wherein the seventh step comprises a step for dividing the structure such that one or more semiconductor elements are comprised inside each insulating layer, respectively.

9. The semiconductor device manufacturing method described in 7 above, wherein the seventh step comprises a step for dividing the structure such that two or more semiconductor elements are comprised inside each insulating layer, respectively.

10. The semiconductor device manufacturing method described in 7 above, wherein the via holes are formed by a laser beam machining in the fourth step.

11. The semiconductor device manufacturing method described in 7 above, wherein a photosensitive resin is used for the material of the insulating layer in the third step, and the via holes are formed by photolithography in the fourth step.

12. The semiconductor device manufacturing method described in 7 above, wherein, in the second step, the semiconductor elements and the wiring patterns corresponding thereto are electrically connected by flip chip mounting.

13. The semiconductor device manufacturing method described in 7 above, wherein, in the second step, the semiconductor elements and the wiring patterns corresponding thereto are electrically connected using an anisotropically conductive film.

With the semiconductor device described in 1 above, when a plurality of semiconductor elements is mounted in a single package, the configuration can be made reliable and compact, as a consequence of which it becomes possible to more effectively realize higher integration and higher functionality.

In the device described in 1 above, the wiring patterns need not all be on insulation layers. Nor do all of the semiconductor elements need be inside the insulation layers. Nor is it necessary that the wiring patterns all be electrically connected to each other. The present invention also comprehends such cases as these.

Accordingly, as indicated in 1, 2, and 3 above, all of the combinations, namely of an insulating layer or layers not containing a semiconductor element, of an insulating layer or layers containing only one semiconductor element, or of an insulating layer or layers containing a plurality of semiconductor elements, come within the scope of the present invention.

The present invention, furthermore, is particularly useful in cases where the semiconductor elements used are thin and the thickness required in the mountings thereof is thin, and flip chip mounting and anisotropically conductive film mounting are especially effective when the thickness of the semiconductor elements is 50 µm or less.

The manufacture of the semiconductor device described in 1 above can be effected in stages as described in 7, and the via holes can be formed by laser beam machining or photolithography. When the final division into semiconductor devices is made, as described in 8 and 9 above, the division can be performed so that either one or more semiconductors are contained in each insulating layer.

DESCRIPTION OF THE PREFERRED EMBODIMENTS

Embodiments of the present invention are described below. These embodiments are for the purpose of exemplifying the present invention, however, and do not limit the scope of the present invention.

Figure 1A:
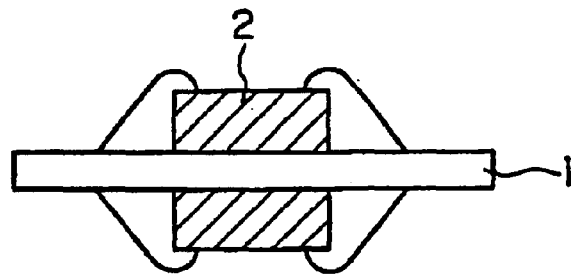
FIG. 1 is a diagram for describing problems with a semiconductor device relating to the prior art.
Figure 1B:
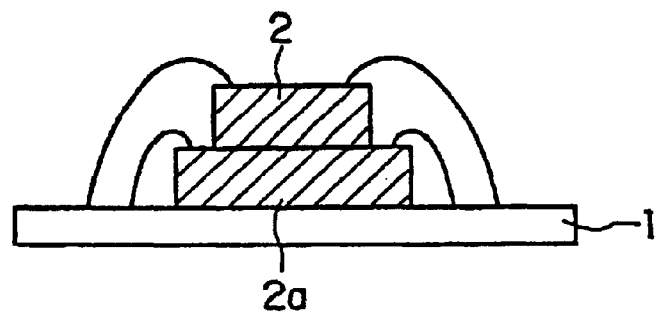
Figure 1C:
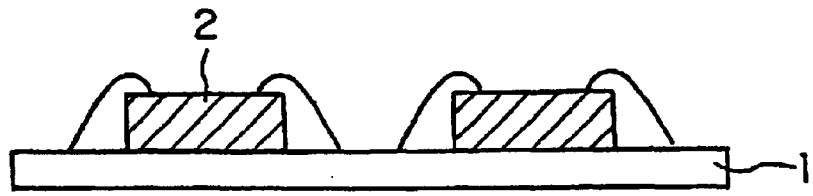
Figure 1D:
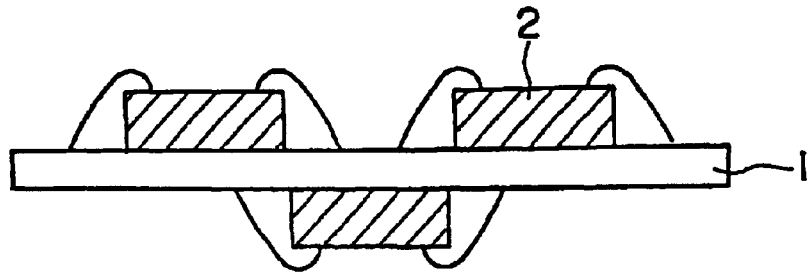
Figure 2:
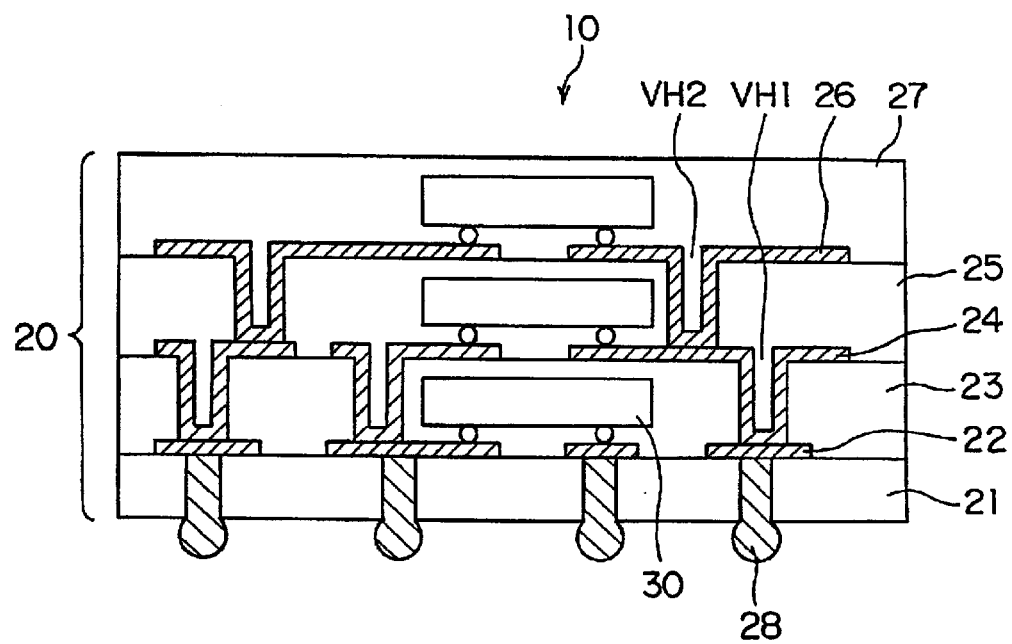
FIG. 2 is a cross-sectional diagram that schematically represents the structure of a semiconductor device relating to one embodiment of the present invention.

FIG. 2 represents schematically the cross-sectional structure of a semiconductor device relating to one embodiment of the present invention.

The semiconductor device 10 relating to this embodiment is configured by a multi-layer wiring board 20 which is provided as a semiconductor package and has, as the base thereof, a base substrate on one surface of which are formed wiring patterns, and a plurality (3 in the example diagrammed) of semiconductor chips 30 imbedded and mounted Ace inside that package (multi-layer wiring board) 20. In this embodiment, an example of a chip size package (CSP) having a structure in which the semiconductor chips 30 are stacked inside the package 20 and sealed with a resin is specifically described. A package having such a structure is hereinafter called a "stacked CSP."

In the multi-layer wiring board 20, symbol 21 designates an insulative substrate (base substrate) that constitutes the base for the wiring board, symbol 22 a conductor layer (first-layer wiring pattern) formed and patterned in the requisite shape on the base substrate 21, symbol 23 an insulating layer (first build-up layer) formed so as to cover the base substrate 21 and the wiring pattern 22, symbol VH1 a via hole formed at a certain position in the insulating layer 23 so as to reach to the wiring patterns 22, symbol 24 a conductor layer (second-layer wiring pattern) formed and patterned in the requisite shape on the insulating layer 23 inclusive of the inner wall of the via hole VH1, symbol 25 an insulating layer (second build-up layer) formed so as to cover the insulating layer 23 and the wiring patterns 24, symbol VH2 a via hole formed at a certain position in the insulating layer 25 so as to reach to the wiring pattern 24, symbol 26 a conductor layer (third layer wiring pattern) formed and patterned in the requisite shape on the insulating layer 25 inclusive of the inner wall of the via hole VH2, and symbol 27 an insulating layer (third build-up layer) formed so as to cover the insulating layer 25 and the wiring pattern 26. The insulating layer 27 at the uppermost layer also fulfills the role of a protective film for the device 10. The symbol 28, furthermore, designates a solder bump that functions as an external connection terminal for the device 10, and the solder bump 28 passes through the base substrate 21 and is connected to the first-layer wiring pattern 22, as diagrammed, and protrudes as a ball from the lower surface of the base substrate 21.

It is preferable that the semiconductor chips 30 used be as thin as possible so that they can be deployed stacked up inside the package (multi-layer wiring board) 20.

With current technology, semiconductor chips are provided having thicknesses ranging from 50 $\mu$m to 100 $\mu$m or so. If the semiconductor chip is of such a thickness, it is sufficiently possible, technically, to imbed and mount the chip inside the substrate, but a thickness of 50 $\mu$m or less is preferable in order to achieve the object of the present invention.

In this embodiment, semiconductor chips 30 having a thickness of 50 $\mu$m or so are used.

In the semiconductor device (stacked CSP) 10 relating to this embodiment, the semiconductor chips 30 are electrically connected to the wiring patterns 22, 24, and 26 that are covered respectively by the corresponding insulating layers 23, 25, and 27, and are arranged in a stacked from, as seen in a cross sectional view in a direction perpendicular to the plane of the surface of the package 20. Particularly, they can be arranged such that they are mutually superimposed, when the package 20 is looked at in a plan view.

Figure 3A:
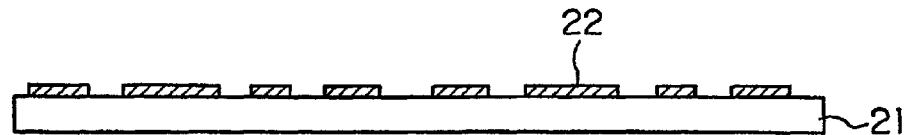
FIG. 3 provides cross-sectional views showing manufacturing steps for the semiconductor device in FIG. 2.

A method for manufacturing the semiconductor device (stacked CSP) 10 of this embodiment is described below with reference to FIG. 3 and FIG. 4 which sequentially diagram the manufacturing steps therein.

In a first step (cf. FIG. 3A), the first-layer wiring pattern (conductor layer) 22 is formed on the insulative base substrate 21. For the material of the base substrate 21, a glass epoxy resin or glass BT (bis-maleimide triazine) resin or the like is used, while copper (Cu) is typically used for the material of the conductor layer 22.

The first-layer wiring pattern 22 is formed as follows, for example.

First, a thin-film form copper layer is formed by non-electrolytic copper-plating so as to cover the surface (on one side) of the base substrate 21.

Then a photosensitive resist (not shown) is applied onto the thin-film form copper layer, and exposure and development (resist patterning) are performed according to the shape of the first-layer wiring pattern 22.

Next, using that resist pattern as a plating mask, copper electroplating is performed, using the thin-film form copper layer as a plating power supply layer, and a relatively thick conductor layer is formed.

After that, the resist pattern is removed, the exposed portions of the thin-film form copper layer are removed by etching, and the conductor layer (first-layer wiring pattern 22) patterned as diagrammed is formed.

Instead of the technique employing plating as described above, a method in which a substrate of a glass epoxy resin or glass BT resin or the like having copper foil bonded to the surface thereof is used, and the wiring pattern is formed by etching that copper foil, is also useful as a method for forming the wiring pattern (conductor layer) on the insulative base substrate, and is comprehended in the scope of the present invention.

In the next step (cf. FIG. 3B), the requisite number of semiconductor chips 30 is mounted by flip chip connection on the wiring pattern 22 formed on the base substrate 21. This flip chip mounting is effected by thermally pressing the bumps (electrode terminals) bonded to the electrode pads of the semiconductor chips 30 against corresponding portions on the wiring pattern 22.

Figure 3B:
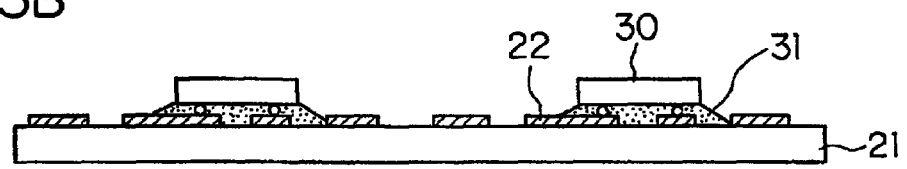
Figure 3C:
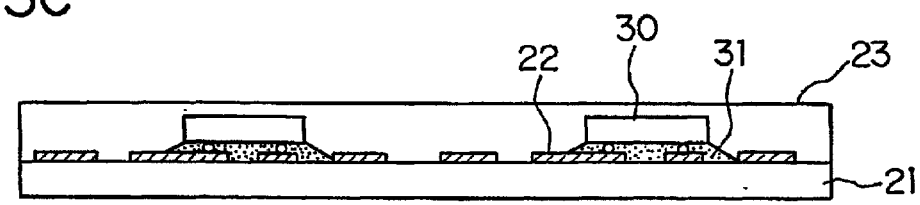
Figure 3D:
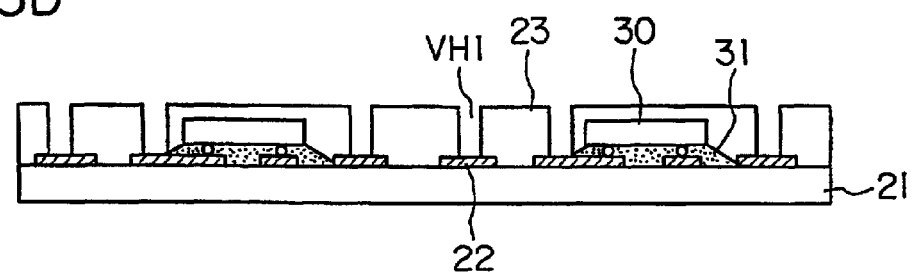
Figure 3E:
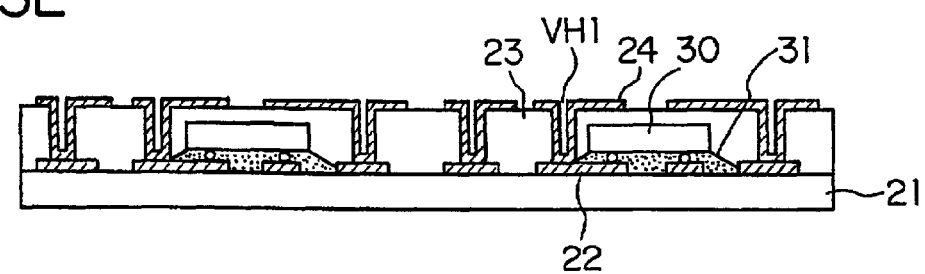
Figure 4A:
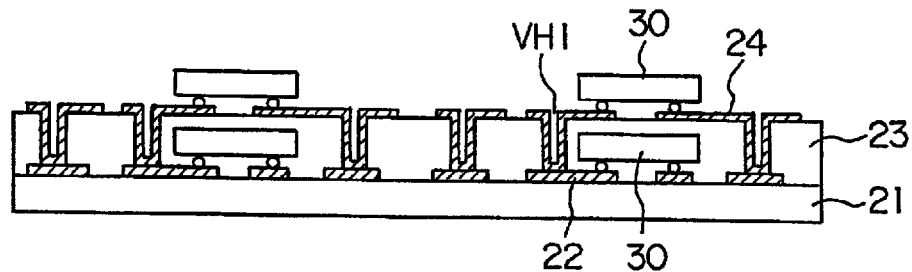
FIG. 4 provides cross-sectional views showing manufacturing steps that follow the manufacturing steps diagrammed in FIG. 3.
Figure 4B:
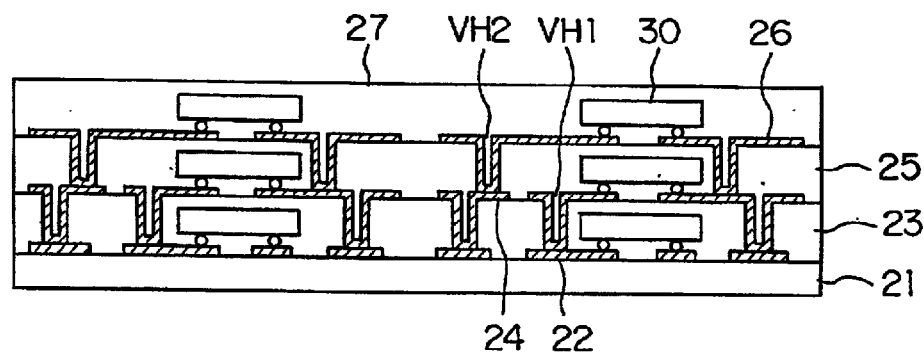
Figure 4C:
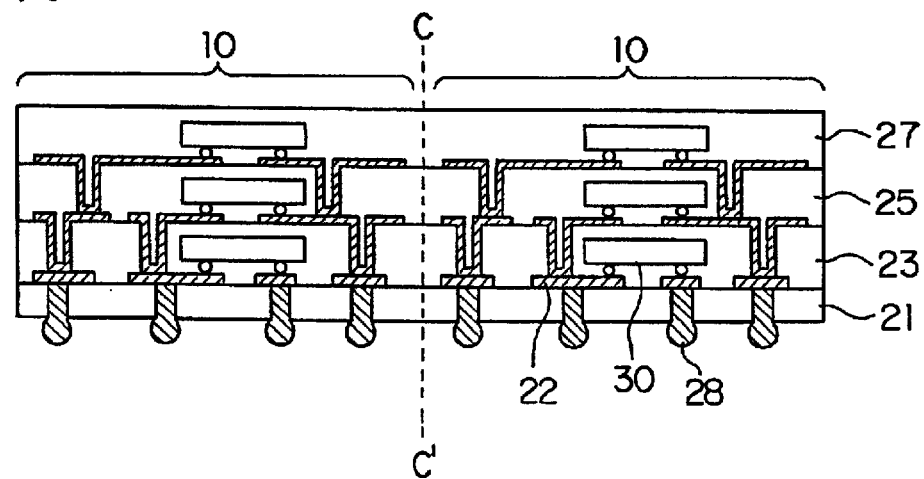

When effecting these flip chip connections, as diagrammed in FIG. 3B, reinforcing the lower parts of the semiconductor chips with an underfilling 31 consisting of resin or the like is effective in making the attachment of semiconductor elements strong and secure.

In the next step (cf. FIG. 3C), the insulating layer (first build-up layer) 23 is formed on the base substrate 21 and the wiring pattern 22 so as to cover the semiconductor chips 30. For the material of the insulating layer 23, a thermosetting resin such as an epoxy resin, phenol resin or polyimide resin is used, for example. Alternatively, a photosensitive resin such as a photosensitive epoxy resin or photosensitive polyimide resin or the like may be used.

In the next step (cf. FIG. 3D), via holes VH1 are formed by a hole opening process using a $CO_2$ laser or excimer laser or the like, so as to reach to the wiring pattern 22, at specific positions in the insulating layer 23 (laser via process).

When a photosensitive resin such as a photosensitive epoxy resin or the like is used as the material for the insulating layer 23, the via holes VH1 can be formed using ordinary photolithographic technology (photo via process). In that case, the via holes VH1 also can of course be formed using a laser beam or the like.

After that, in the event that resin pieces or other contamination has been produced by the hole opening process, a process (deburring or desmearing, etc.) is further performed to remove such, if necessary.

In the next step (cf. FIG. 3E), the second layer wiring pattern (conductor layer) 24 is formed on the insulating layer 23, inclusive of the inner walls of the via holes VH1, in the same manner as in the step diagrammed in FIG. 3A.

That is, a thin-film form copper layer is formed by non-electrolytic copper plating on the insulating layer 23, inclusive of the inner walls of the via holes VH1, a photosensitive resist is applied on that thin-film form copper layer, and exposure and developing (resist patterning) are performed according to the shape of the second layer wiring pattern 24.

Next, using that resist pattern as a plating mask, copper electroplating is performed, using the thin-film form copper layer as the plating power supply layer, and a relatively thick conductor layer is formed.

After that, the resist pattern is removed, the exposed portions of the thin-film form copper film are removed by etching, and the conductor layer (second-layer wiring pattern 24) patterned as diagrammed is obtained.

When that is being done, the conductor layer is formed covering the inner walls of the via holes VH1, and that conductor layer functions as an inter-layer connecting part which electrically connects the first layer wiring pattern 22 and the second layer wiring pattern 24.

In the next step (cf. FIG. 4A), in the same manner as in the step diagrammed in FIG. 3B, the requisite number of semiconductor chips 30 is mounted by flip chip connection on the wiring pattern 24 formed on the insulating layer 23. In this case, as diagrammed, the semiconductor chips 30 mounted on the second-layer wiring pattern 24 can be arranged in a stacked configuration, as seen in a cross-sectional view, onto the semiconductor chips 30 mounted on the first layer wiring pattern 22, and so that they are mutually superimposed as seen in a plan view.

In the next step (cf. FIG. 4B), steps that are the same as the steps diagrammed in FIG. 3C to FIG. 4A described above are repeated until the required number of wiring layers (3 layers in the example diagrammed here) is obtained and, finally, the uppermost insulating layer 27 which functions as a protective film is formed.

In the final step (cf. FIG. 4C), the bumps 28 are formed as external connection terminals on the lower surface side of the base substrate 21, and the structure is divided into the individual stacked CSPs 10.

The bumps 28 are formed as follows. First, through holes are formed by a hole opening process using an excimer laser or the like in the base substrate 21 at portions corresponding to the positions of the terminal formation portions of the first layer wiring pattern (conductor layer) 22. Thereby, the ends of the through holes on one side are blocked by the wiring pattern 22, while the ends on the other side are open on the bottom surface side of the base substrate 21. Next, solder balls are deployed in the through holes and bonded by reflowing. Thereby, the solder balls fill the interiors of the through holes and are electrically connected to the wiring pattern 22, and bumps (external connection terminals) 28 are formed that protrude in ball shapes at the lower surface side of the base substrate 21.

The through holes for forming the bumps 28 need not necessarily be formed at this stage, but may be provided at any stage so long as the main concept of the present invention is not violated. They might be formed beforehand by a laser process at the stage indicated by FIG. 3A, for example.

Furthermore, although not particularly indicated in the drawings, it will be preferable to form a conductor film on the inner walls of the through holes, by copper-plating or the like, in order to enhance the solder wettability thereof, prior to deploying the solder balls in the through holes.

After that, the structure is divided into CSPs, using a dicer or the like, along the division line C–C' as indicated by the broken line. That is, division is effected so that one semiconductor chip 30 is contained inside each insulating layer 23, 25, and 27. In this manner the stacked CSP (semiconductor device) 10 of this embodiment will be fabricated.

As described in the foregoing, with the semiconductor device 10 and manufacturing method therefor relating to this embodiment, the build-up method which is being made increasingly practical in the field of semiconductor packaging in recent years is used effectively, and thin semiconductor chips 30 having a thickness of 50 $\mu$m or so are imbedded and mounted in each build-up layer in a midway stage during the process of stacking up layers by repeatedly and sequentially forming insulating layers, via holes, and conductor layers (wiring patterns) inclusive of the interiors of the via holes by this build-up method.

Accordingly, a plurality of semiconductor chips 30 can be reliably mounted inside a single package (multi-layer wiring board) 20, and, by using semiconductor chips 30 of thin thickness, it is possible to configure the semiconductor device 10 compactly. Thus it is possible to realize higher integration and higher functionality more effectively than in semiconductor devices relating to the prior art.

With the configuration of the semiconductor device 10 of this embodiment, furthermore, the semiconductor chips 30 are deployed in a configuration wherein they are mutually superimposed when seen in a plan view of the multi-layer wiring board 20, wherefore it is possible to effectively improve the integration level of the semiconductor device 10 in the planar dimension.

In the description of the embodiment described in the foregoing, the case where the configuration of the semiconductor device is a stacked CSP is taken as an example, but the configuration of the semiconductor device is of course not limited thereto or thereby. In the step diagrammed in FIG. 4C, for example, in the embodiment described in the foregoing, the structure is divided into respective CSPs so as to obtain individual stacked CSPs 10. However, instead of such a divided form, the divisions may be made in units of a necessary plural number of CSPs.

That is, it is possible to effect division so that two or more semiconductor chips 30 are contained in each insulating layer 23, 25, and 27, respectively.

By effecting such a divided form as that, the semiconductor device can be formed as a stacked MCM (multi-chip module), making it possible to effect even higher functionality in the semiconductor device.

Also, in the embodiment described in the foregoing, flip chip connections are used for electrically connecting the semiconductor chips 30 and the wiring patterns 22, 24, and 26, but it is possible to use anisotropically conductive film (ACF), for example, instead thereof. When such ACF is used, compared to the flip chip connections using bumps as the electrode terminals of the semiconductor chips, the thickness of the insulating layers 23, 25, and 27 that are to be formed to cover the semiconductor chips 30 can be made relatively thinner, wherefore the semiconductor device can be configured even thinner and more compactly.

Also, in the embodiment described in the foregoing, non-electrolytic plating is used as the film forming method for forming the thin-film form copper layer (plating power supply layer) when forming the wiring patterns. Needless to say, however, the film forming method is not limited thereto or thereby. It is also possible to use sputtering or vapor deposition, for example.

In the embodiment described in the foregoing, moreover, the means (inter-layer connection parts) for electrically connecting the wiring patterns on the upper layer side and the wiring patterns on the lower level side are configured by conductor layers formed on the inner wall surfaces of the via holes VH1 and VH2. Instead of such a configuration, however, the structure may be made in a solid body, that is, in a structure of "fill-in vias," which are formed by filling the interiors of the via holes with a conducting material such as copper plating, as diagrammed in FIG. 5. As diagrammed in FIG. 5, with the fill-in via 32 structure, vias can be formed immediately above vias, wherefore the wiring density can be raised, and, as a consequence, the semiconductor device can be made even smaller.

Figure 5:
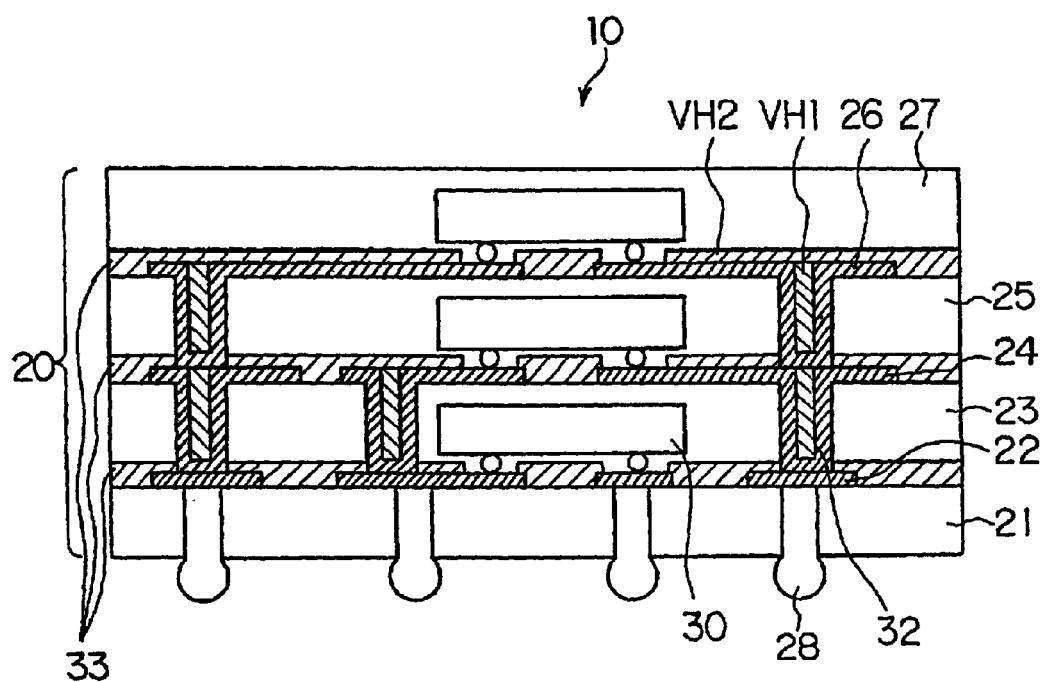
FIG. 5 is a cross-sectional view illustrating an imbedded via structure.

Also, after forming the wiring patterns, as exemplified in FIG. 5, solder resist layers 33 can be deployed so as to cover the wiring patterns, base substrate, and insulating layers, prior to mounting the semiconductor chips.

The role of the solder resist layers is to prevent molten solder from flowing out to other portions of the wiring patterns when connecting the semiconductor chips to the wiring patterns by flip chip connections, in cases where the bumps on the semiconductor chips are formed by solder.

These solder resist layers can be deployed irrespective of whether via holes are present or not. They can be deployed after the step diagrammed in FIG. 3A or in FIG. 3E, for example. Needless to say, moreover, the solder resist layers must be formed so that the regions of the semiconductor chips where the flip chip connections are to be made are exposed, in order to make it possible to mount the semiconductor chips.

The material used to form the solder resist layers may be the same as the material used to form the insulating layers and, in the case of a non-photosensitive resin, screen printing is applied to form the requisite patterns. In the case of a photosensitive resin, using a photolithographic process, the resin is applied onto the wiring patterns, base substrate, and insulating layers, and then exposure and development are performed to form the requisite patterns.

In the present invention, furthermore, in order to realize thin semiconductor elements represented by thickness 50 $\mu$m or less, a method of directly mounting the thin semiconductor chips can be performed. However, there are cases where the yield in the flip chip connections deteriorates because of the difficulty of handling the thin semiconductor chips represented by thicknesses of 50 $\mu$m or less.

Figure 6A:
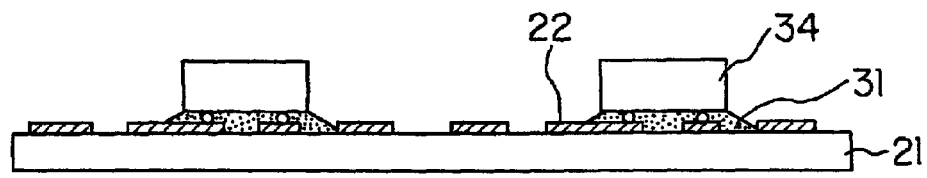
FIG. 6 provides cross-sectional views showing manufacturing steps for grinding and polishing the back surfaces of semiconductor chips after flip chip connection has been effected.
Figure 6B:
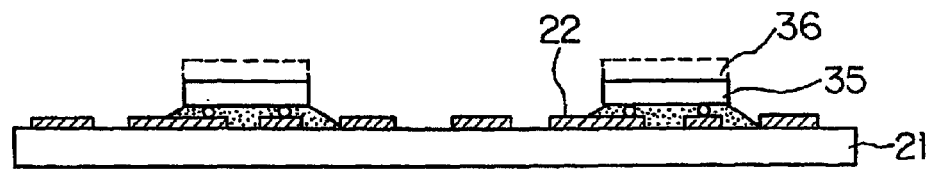
Figure 6C:
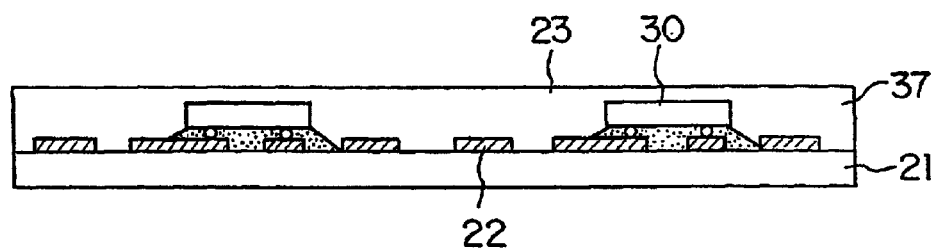

Thereupon, as diagrammed in FIGS. 6A, 6B, and 6C, the method of grinding and polishing the back surfaces of the semiconductor chips after flip chip connection is preferable as means for realizing the thin semiconductor elements represented by thicknesses of 50 $\mu$m or less, in the present invention, and belongs to the category of the present invention. This is described more concretely below with reference to FIG. 6.

As diagrammed in FIG. 6A, thicker semiconductor chips 34 (having a thickness of 300 $\mu$m, for example) are flip-chip connected to the wiring pattern and reinforced with an underfilling 31.

Then the back surfaces are ground and polished to make thin semiconductor chips 35 (having a thickness of 50 $\mu$m or less, for example), as diagrammed in FIG. 6B. The portions 36 enclosed by the dotted lines are the portions ground and polished away.

Then an insulating layer 37 is deployed, as diagrammed in FIG. 6C.

Based on this method, handling thin semiconductor chips can be avoided, and one may expect semiconductor device manufacturing yield to be improved.

It is noted that, in the foregoing, in the steps illustrated in the figures other than FIGS. 3 and 6, descriptions about reinforcement by underfilling is omitted even if it is possible. Needless to say, moreover, reinforcement by underfilling can be omitted in cases where it is possible to effect strong and secure semiconductor chip connections.

In the embodiment described in the foregoing, moreover, a glass epoxy resin or glass BT resin or the like is used for the base substrate 21, but a film comprising a polyimide resin or the like may be used instead.

In that case, by applying a polyimide-based thermoplastic adhesive onto the surface of a polyimide resin film, for example, thermally press-bonding a copper (Cu) foil thereon, and then performing photo-etching or the like, a substrate which is equivalent to the base substrate 21 and wiring pattern 22 can be fabricated.

According to the present invention, as described in the foregoing, a plurality of semiconductor elements can be mounted in a single package, and the configuration thereof can be made reliable and compact. Also, the semiconductor elements can be deployed in a configuration such that they are stacked up as seen in a cross-sectional view, and such that they are mutually superimposed as seen in a plan view. Hence higher integration and higher functionality can be realized more effectively.

What is claimed is:

1. A semiconductor device manufacturing method, comprising:

forming an initial conductor layer, comprising a wiring pattern, on an upper surface of an insulative base substrate;

mounting an initial semiconductor element on said initial conductor layer;

forming an initial insulating layer on said base substrate and said initial conductor layer so as to concurrently cover said initial semiconductor element and said initial conductor layer;

forming via holes in said initial insulating layer, extending to said initial conductor layer on said base substrate;

forming a further conductor layer, comprising a wiring pattern, on said initial insulating layer inclusive of inner walls of said via holes;

mounting a further semiconductor element on the further conductor layer;

forming a further insulating layer so as to concurrently cover the further semiconductor element and the further conductor layer;

forming, on a bottom surface of said base substrate, external connection terminals electrically connected through the base substrate with the wiring pattern of the initial conductive layer.

2. The semiconductor device manufacturing method according to claim 1, wherein each successive insulating layer embeds respective, plural semiconductor elements, and the forming on the bottom surface is followed by effecting division of the semiconductor device, thus formed, to plural stacked semiconductor devices so that, in each divided, stacked semiconductor device, one or more semiconductor elements is/are embedded inside each successive insulating layer.

3. The semiconductor device manufacturing method according to claim 1, wherein the via holes are formed by laser beam machining.

4. The semiconductor device manufacturing method according to claim 1, wherein a material of the initial and further insulating layers comprises a photosensitive resin and the via holes are formed by photolithography.

5. The semiconductor device manufacturing method according to claim 1, wherein said the initial and further semiconductor elements and the respective, initial and further conductor layers on which they are mounted are electrically connected by flip chip mounting.

6. The semiconductor device manufacturing method according to claim 1, wherein the initial and further semiconductor elements and the respective, initial and further conductor layers are electrically connected using an anisotropically conductive film.

7. A method of manufacturing a stacked semiconductor device, comprising:
    forming an initial conductor layer, comprising a wiring pattern, on an upper surface of an insulative base substrate;
    mounting an initial semiconductor element on the initial conductor layer;
    forming an initial insulating layer on the base substrate and the initial conductor layer so as to concurrently cover the initial semiconductor element and the initial conductor layer;
    forming via holes in the initial insulating layer, extending to the initial conductor layer on the base substrate;
    forming a further conductor layer, comprising a wiring pattern, on the initial insulating layer inclusive of inner walls of the via holes;
    mounting a further semiconductor element on the further conductor layer;
    forming a further insulating layer so as to concurrently cover the further semiconductor element and the further conductor layer;
    forming via holes in the further insulating layer so as to extend to the further conductor layer;
    forming successive, further conductor layers and corresponding insulating layers with a respective, further semiconductor element mounted on each further conductor layer and covered with the corresponding, further insulating layer; and
    forming, on a bottom surface of the base substrate, external connection terminals passing through said base substrate and electrically connected with said wiring pattern of said initial conductor layer on said base substrate.

8. The method of manufacturing a stacked semiconductor device according to claim 7, further comprising:
    mounting plural semiconductor elements on each initial conductor layer and each further conductor layer; and
    following the forming of external connection terminals on the bottom surface of the base substrate, effecting division of the substrate so that one or more respective semiconductor elements is/are embedded inside each successive insulating layer.

9. The method of manufacturing a stacked semiconductor device according to claim 7, wherein said via holes are formed by laser beam machining.

10. The method of manufacturing a stacked semiconductor device according to claim 7, wherein a material of the initial and successive, further insulating layers comprises a photosensitive resin and via holes are formed by photolithography.

11. The method of manufacturing a stacked semiconductor device according to claim 7, wherein the initial and successive, further semiconductor elements and the respective and successive, further conductor layers on which they are mounted are electrically connected by flip chip mounting.

12. The method of manufacturing a stacked semiconductor device according to claim 7, wherein the initial and further semiconductor elements and the respective, identical and further conductor layers are electrically connected using an anisotropically conductive film.

13. A method of manufacturing a semiconductor device of plural device layers stacked, in succession, on a main surface of a substrate and comprising an initial device layer formed on the main surface of the substrate, one or more successive layers, each formed on a respective underlying device layer, and a final layer, wherein said method comprises:
    for forming the initial device layer, performing a first process of:
        forming an initial conductor layer, comprising a wiring pattern, on an upper surface of an insulative base substrate,
        mounting an initial semiconductor element on said initial conductor layer,
        forming an initial insulating layer on the base substrate, concurrently covering the initial semiconductor element and the initial conductor layer, and,
        forming via holes in the initial insulating layer, extending selectively to the wiring portion of said underlying, initial conductor layer on the base substrate;
    for forming each of one or more successive device layers, each on an underlying, next preceding device layer, performing a second process of:
        forming a further conductor layer, comprising a wiring pattern, on the respective, underlying insulating layer, inclusive of inner walls of the via holes therein and extending therethrough to contact the wiring pattern of the respective, underlying conductor layer,
        mounting a further semiconductor element on the further conductor layer,
        forming a further insulating layer on said base substrate, so as to concurrently cover the further semiconductor element and the further conductor layer; to form a next successive layer as a device layer, performing a third process of forming via holes in the further insulating layer of the respective, underlying device layer and so as to extend selectively to the wiring pattern of the respective underlying conductor layer thereof, and then performing the second process again, and, alternatively, to form a next successive layer as the final layer, performing an alternative third process of forming an insulating layer on the respective underlying conductor layer; and forming, on a bottom surface of the base substrate, external connection terminals which are electrically connected with the initial conductor layer on the base substrate, passing through the base substrate.

14. The method of manufacturing a stacked semiconductor device according to claim 13, further comprising:

mounting plural semiconductor elements on each of the initial conductor layer and each further conductor layer; and following the forming of external connection terminals on the bottom surface of the base substrate, effecting division of the substrate so that one or more respective semiconductor elements is/are embedded inside each successive insulating layer.

15. The method of manufacturing a stacked semiconductor device according to claim 13, wherein said via holes are formed by laser beam machining.

16. The method of manufacturing a stacked semiconductor device according to claim 13, wherein a material of said initial and said successive, further insulating layers comprises a photosensitive resin and said via holes are formed by photolithography.

17. The method of manufacturing a stacked semiconductor device according to claim 13, wherein the initial and successive, further semiconductor elements and the respective and successive, further conductor layers on which they are mounted are electrically connected by flip chip mounting.

18. The method of manufacturing a stacked semiconductor device according to claim 13, wherein the initial and successive, further said semiconductor elements and the respective and successive, further conductor layers are electrically connected using an anisotropically conductive film.

* * * * *

UNITED STATES PATENT AND TRADEMARK OFFICE
CERTIFICATE OF CORRECTION

PATENT NO. : 6,759,268 B2
APPLICATION NO. : 10/158155
DATED : June 6, 2004
INVENTOR(S) : Masatoshi Akagawa It is certified that error appears in the above-identified patent and that said Letters Patent is hereby corrected as shown below:

In column 12, line 63, begin a new paragraph after "layer;".

Signed and Sealed this

Eighth Day of January, 2008

JON W. DUDAS
*Director of the United States Patent and Trademark Office*